United States Patent
Lu et al.

(10) Patent No.: US 8,207,451 B2
(45) Date of Patent: Jun. 26, 2012

(54) GROUND-PLANE SLOTTED TYPE SIGNAL TRANSMISSION CIRCUIT BOARD

(75) Inventors: Hsin-Chia Lu, Taipei (TW); Tsung-Yi Chou, Taipei (TW)

(73) Assignee: National Taiwan University, Taipei (TW)

( * ) Notice: Subject to any disclaimer, the term of this patent is extended or adjusted under 35 U.S.C. 154(b) by 880 days.

(21) Appl. No.: 12/284,677

(22) Filed: Sep. 24, 2008

(65) Prior Publication Data
US 2009/0255720 A1    Oct. 15, 2009

(30) Foreign Application Priority Data

Apr. 15, 2008 (TW) ................................ 97113563 A (51) Int. Cl.
    *H05K 1/11*    (2006.01)
(52) U.S. Cl. ........................................ 174/262; 174/255
(58) Field of Classification Search ................... 333/33, 333/34, 161, 233, 236, 238, 245–247
See application file for complete search history.

(56) References Cited

U.S. PATENT DOCUMENTS

| 6,624,729 B2 * | 9/2003 | Wright et al. ................. 333/238 |
| 7,145,411 B1 * | 12/2006 | Blair et al. ........................ 333/5 |
| 7,292,452 B2 * | 11/2007 | Ng et al. ....................... 361/780 |
| 7,626,476 B2 * | 12/2009 | Kim et al. ..................... 333/238 |

* cited by examiner

*Primary Examiner* — Ishwarbhai Patel
(74) *Attorney, Agent, or Firm* — Peter F. Corless; Steven M. Jensen; Edwards Wildman Palmer LLP (57) ABSTRACT

A ground-plane slotted type signal transmission circuit board is proposed, which is designed for use with a high-speed digital signal processing system for providing a low-loss signal transmission function. The proposed circuit board structure is characterized by the formation of a slotted structure (i.e., elongated cutaway portion) in the ground plane at the beneath of each signal line. Since the slotted structure is a void portion, the electric field of a gigahertz signal being transmitting through the overlaying signal line would be unable to induce electric currents in the void portion of the ground plane. This feature allows the prevention of a leakage current that would otherwise flow from the signal line to the ground plane, and therefore can help prevent unnecessary power loss of the transmitted signal.

20 Claims, 8 Drawing Sheets

GROUND-PLANE SLOTTED TYPE SIGNAL TRANSMISSION CIRCUIT BOARD

BACKGROUND OF THE INVENTION

1. Field of the Invention

This invention relates to high-frequency electronic circuit technology, and more particularly, to a ground-plane slotted type signal transmission circuit board which is designed for use with a high-speed digital signal processing system for providing a low-loss signal transmission function.

2. Description of Related Art

With the advent of wireless digital communication technologies, such as wireless networking, mobile phones, GPS (Global Positioning System), etc., the design and manufacture of high-speed digital circuit boards that handle digital signals within the gigahertz range is in high demand in the electronics industry. In circuit layout design, high-speed digital circuit boards typically use microstrips or striplines as signal lines for conveying digital signals within the gigahertz frequency range.

Figure 1:
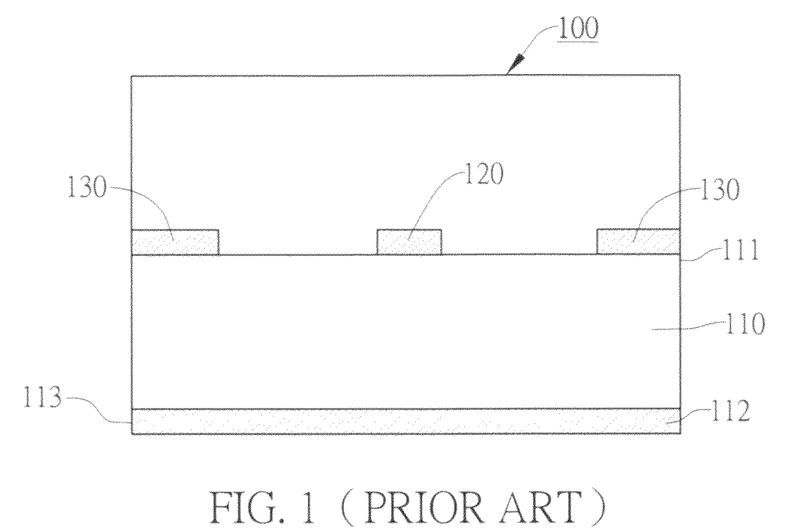
FIG. 1 (PRIOR ART) is a schematic diagram showing a cross-sectional view of the internal structure of a conventional GCPW (Grounded Coplanar Waveguide) circuit board.
Figure 2:
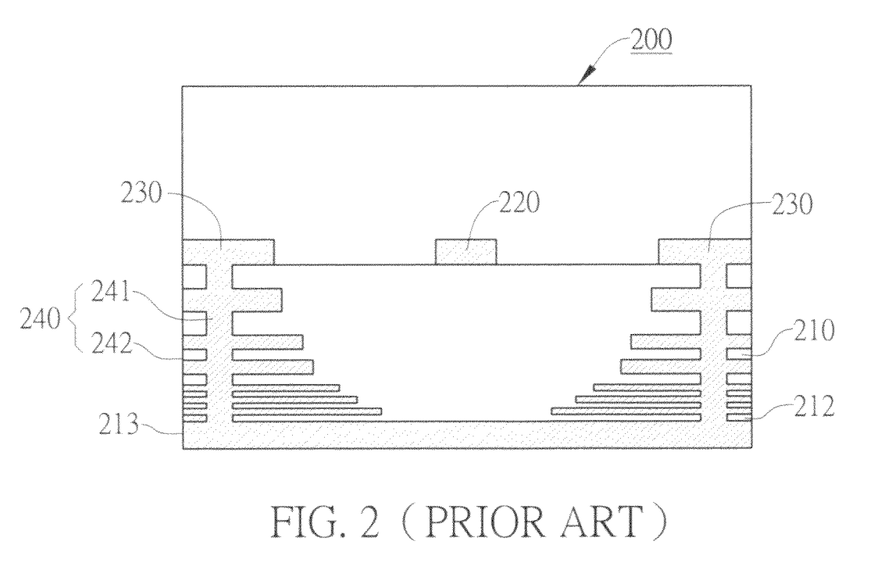
FIG. 2 (PRIOR ART) is a schematic diagram showing a cross-sectional view of the internal structure of a conventional semi-coaxial type circuit board.

Presently, the electronic industry has developed various different types of high-speed digital signal transmission circuit board structures. FIG. 1 and FIG. 2 show two examples of conventional circuit board structures that are widely utilized for transmission of high-speed digital signals. For description of theory and principle of these two conventional types of high-speed digital signal transmission circuit board structure, please referred to the technical paper entitled *"Novel CMOS Low-loss Transmission Line Structure"* authored by Jaewon Kim et al and published on IEEE Radio and Wireless Conference, pp. 235-238, September 2004.

FIG. 1 shows the structure of a conventional GCPW (Grounded Coplanar Waveguide) type of circuit board structure 100. As shown, this GCPW circuit board structure 100 comprises: (A) a substrate 110; (B) a signal line 120; and (C) a pair of grounding lines 130. In this GCPW circuit board structure 100, the substrate 110 is made of a dielectric material with a front surface 111 and an opposite back surface 112; wherein the opposite back surface 112 is coated with an electrically conductive material to serve as a ground plane 113. The signal line 120 is laid over the front surface 111 of the substrate 110 for use as a signal conveying line. The grounding lines 130 are printed circuit lines laid over the front surface 111 of the substrate 110 extending alongside the signal line 120. In practice, the signal line 120 can be used for transmission of high-speed digital signals.

In practical applications, however, since the thickness of the dielectric material of the substrate 110 (i.e., the distance between the front surface 111 and the back surface 112) is very small, it could easily allow the electric fields of the high-speed digital signals being transmitting over the signal line 120 to cause an induced current, thus undesirably resulting in a leakage current that flows from the signal line 120 through the substrate 110 to the ground plane 113 on the back surface 112. This leakage current will then cause a large attenuation to the high-speed digital signals.

FIG. 2 shows the structure of a conventional semi-coaxial type of circuit board structure 200. As shown, this semi-coaxial type circuit board structure 200 comprises: (A) a substrate 210; (B) a signal line 220; (C) a pair of grounding lines 230; and (D) a stack-type via structure 240. The semi-coaxial type circuit board structure 200 shown in FIG. 2 differs from the GCPW circuit board structure 100 shown in FIG. 1 only in the addition of the stack-type via structure 240, which is composed of an electrically conductive pillar 241 and a plurality of stacked electrically-conductive planes 242; wherein the electrically conductive pillar 241 extends from the front surface 211 to the back surface 212 of the substrate 210; while the stacked electrically-conductive planes 242 are substantially parallel to the front surface 211 and the back surface 212 of the substrate 210, and the multiple planes thereof are gradually increased in widths from top to bottom to form a tapered ladder-like structure which is functionally equivalent to a semi-coaxial transmission line.

However, the semi-coaxial type circuit board structure 200 shown in FIG. 2 is fundamentally similar to the GCPW circuit board structure 100 shown in FIG. 1. As a consequence, the issue of leakage current induced in the ground plane still exists.

SUMMARY OF THE INVENTION

It is therefore an objective of this invention to provide a ground-plane slotted type signal transmission circuit board which can help reduce the above-mentioned problem of leakage current induced in the ground plane for the purpose of minimizing signal attenuation.

The ground-plane slotted type signal transmission circuit board according to the invention is designed for use with a high-speed digital signal processing system for providing a low-loss signal transmission function.

In assembly, the ground-plane slotted type signal transmission circuit board according to the invention comprises: (A) a substrate, which has a first surface and an opposite second surface, and whose second surface is formed with a ground plane; (B) a signal line structure, which is formed over the first surface of the substrate for use as a signal transmission channel; (C) a grounding line, which is laid over the first surface of the substrate and extends alongside the signal transmission structure; (D) a via structure, which penetrates through the substrate for connecting the grounding line on the first surface of the substrate to the ground plane on the second surface of the substrate; and (E) a slotted structure, which is a cutaway portion of the ground plane on the second surface of the substrate aligned substantially in parallel to each line of the signal line structure on the first surface of the substrate.

The ground-plane slotted type signal transmission circuit board according to the invention is characterized by the formation of a slotted structure (i.e., elongated cutaway portion) in the ground plane at the beneath of each signal line. Since the slotted structure is a void portion, the electric field of a gigahertz signal being transmitting through the overlaying signal line would be unable to induce electric currents in the void portion of the ground plane. This feature allows the prevention of a leakage current that would otherwise flow from the signal line(s) to the ground plane, and therefore can help prevent unnecessary power loss of the transmitted signal.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The ground-plane slotted type signal transmission circuit board according to the invention is disclosed in full details by way of preferred embodiments in the following with reference to the accompanying drawings.

Application and Function of the Invention

Figure 3:
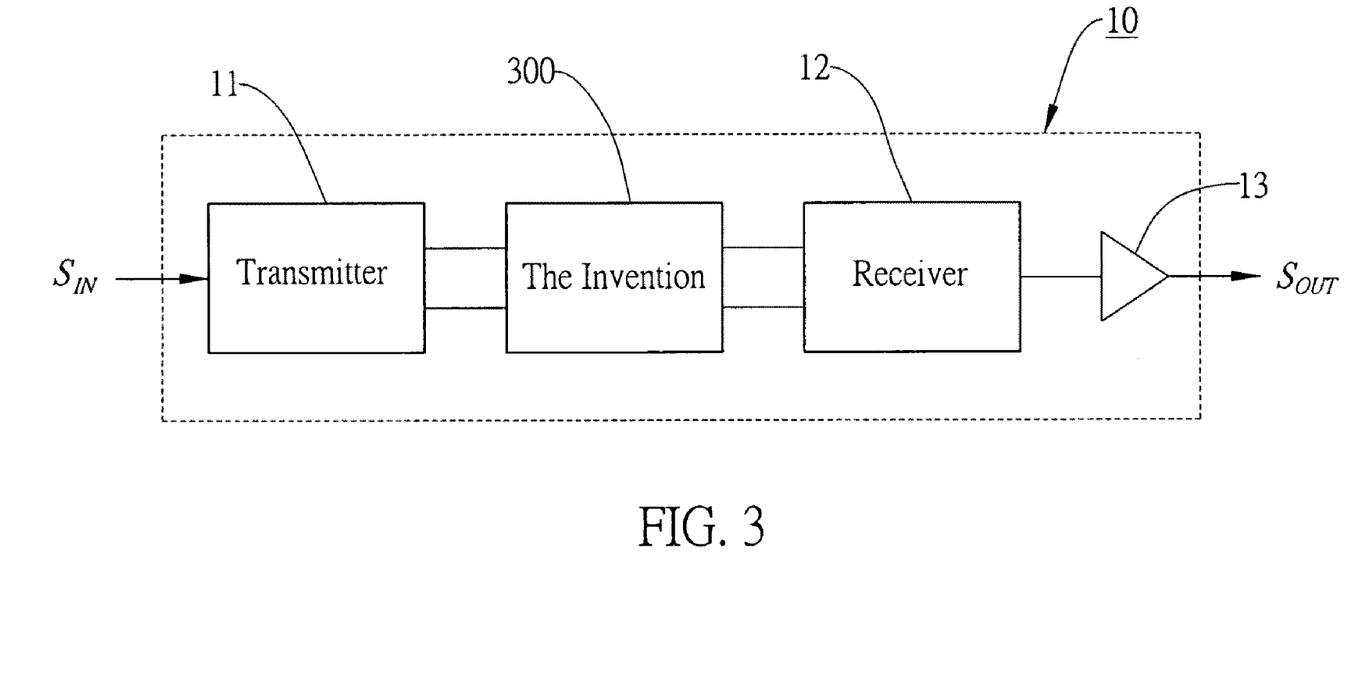
FIG. 3 is a schematic diagram showing an example of the application of the ground-plane slotted type signal transmission circuit board of the invention.

FIG. 3 is a schematic diagram showing an application of the ground-plane slotted type signal transmission circuit board of the invention (which is here encapsulated in a box indicated by the reference numeral 300). As shown, the ground-plane slotted type signal transmission circuit board of the invention 300 is designed for integration to a gigahertz signal processing system 10 having a transmitter 11, a receiver 12, and a buffer 13, and which is connected between the transmitter 11 and the receiver 12 for internal transmission of an input signal $S_{in}$ (which is for example a high-speed digital signal) received by the transmitter 11 to the receiver 12. It is to be noted that the invention is not limited to the application on the gigahertz signal processing system 10 shown in FIG. 3, can instead be used for integration to various other types of circuit systems.

In practical applications, for example, the ground-plane slotted type signal transmission circuit board of the invention 300 can also be utilized as a passive component for integration to the gigahertz signal processing system 10, such as a filter or a power divider.

First Preferred Embodiment of the Invention

Figure 4A:
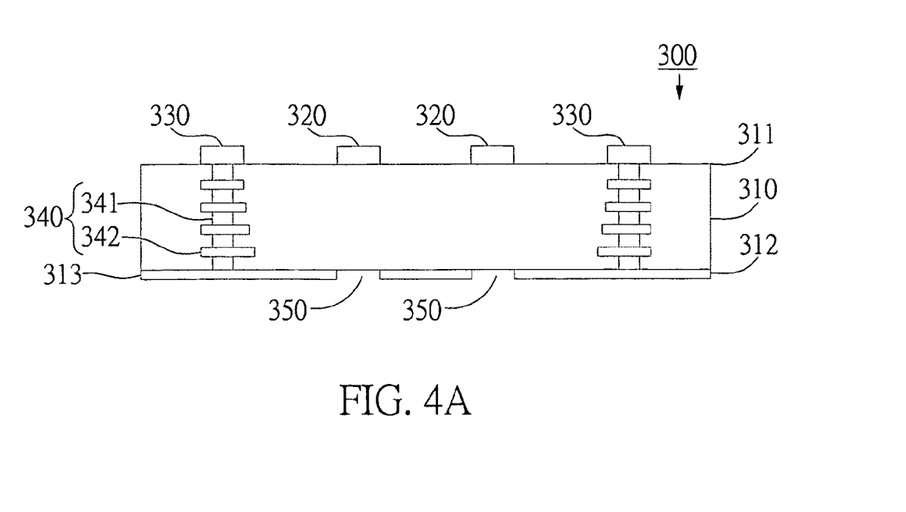
FIG. 4A is a schematic diagram showing a cross-sectional view of the internal structure of a first preferred embodiment of the ground-plane slotted type signal transmission circuit board of the invention.
Figure 4B:
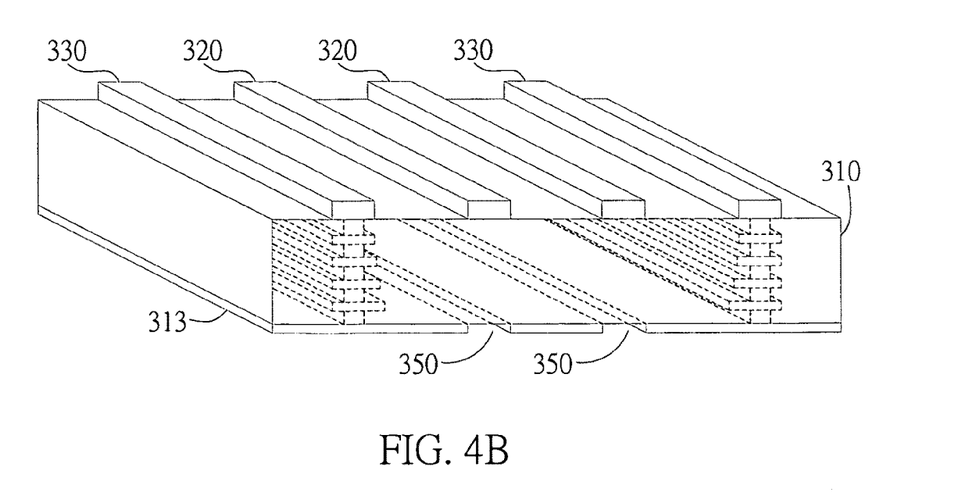
FIG. 4B is a schematic diagram showing a perspective view of the first preferred embodiment of the ground-plane slotted type signal transmission circuit board of the invention.

FIGS. 4A-4B show a first preferred embodiment of the ground-plane slotted type signal transmission circuit board of the invention 300, which comprises: (A) a substrate 310; (B) a signal line layout structure 320; (C) a grounding line layout structure 330; (D) a via structure 340; and (E) a slotted structure 350. Firstly, the respective attributes and functions of these constituent elements of the invention are described in details in the following.

Substrate 310

The substrate 310 is made of a dielectric material formed in the shape of a board having a front surface 311 and an opposite back surface 312. In addition, an electrically conductive material is coated over the back surface 312 of the substrate 310 to form a ground plane 313.

Signal Line Layout Structure 320

In this first preferred embodiment shown in FIGS. 4A-4B, the signal line layout structure 320 is designed to include a pair of signal lines for dual-port signal transmission (i.e., for transmission of a pair of differential signals), and is laid over the front surface 311 of the substrate 310 for transmission of differential signals. In the application of 4 Gbps (gigabits per second) high-speed digital signal transmission, the paired two signal lines can be implemented with internal on-chip circuit layout, with a width of 5 μm (micrometer) for each signal line and a separating distance of 10.8 μm between the two signal lines.

Grounding Line Layout Structure 330

The grounding line layout structure 330 is laid over the front surface 311 of the substrate 310 and includes a pair of electrically-conductive lines extending on both sides of the signal line layout structure 320. In the application of 4 Gbps signal transmission, the grounding line layout structure 330 has a line width of 5 μm in circuit layout.

Via Structure 340

The via structure 340 is preferably implemented with a stacked structure composed of an electrically conductive pillar 341 and a plurality of stacked electrically-conductive planes 342; wherein the electrically conductive pillar 341 penetrates through the substrate 310 and is used to connect the grounding line layout structure 330 on the front surface 311 to the ground plane 313 on the back surface 312 of the substrate 310; while the stacked electrically-conductive planes 342 are substantially parallel to the front surface 311 and the back surface 312 of the substrate 310, and the multiple planes thereof are gradually increased in widths from top to bottom to form a tapered ladder-like structure which is functionally equivalent to a semi-coaxial transmission line.

Slotted Structure 350

The slotted structure 350 is an elongated cutaway portion in the ground plane 313 on the back surface 312 of the substrate 310. As illustrated in FIG. 4B, the slotted structure 350 is substantially aligned in parallel to each signal line of the signal line layout structure 320 on the front surface 311 of the substrate 310. In other words, the slotted structure 350 extends beneath and in parallel with the overlaying signal line layout structure 320. Since the slotted structure 350 is a void portion of the ground plane 313, the electrical field of the high-speed digital signal transmitting through the signal line layout structure 320 would cause less induced current in this void portion.

Second Preferred Embodiment of the Invention

Figure 7A:
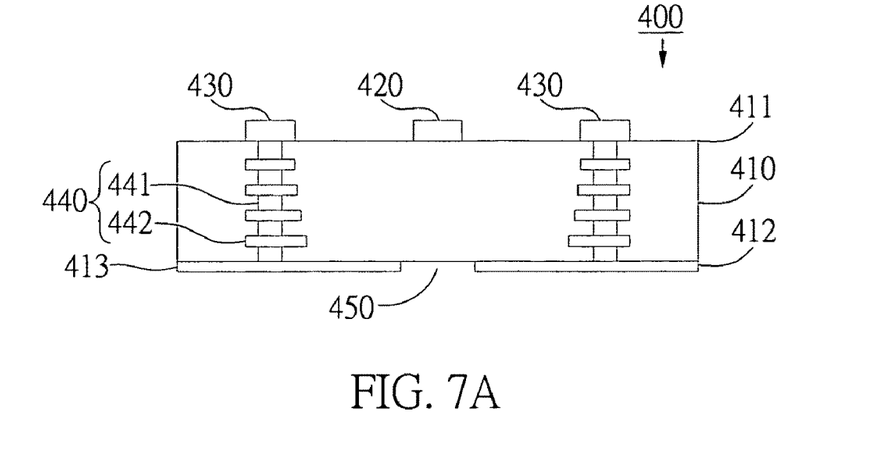
FIG. 7A is a schematic diagram showing a cross-sectional view of the internal structure of a second preferred embodiment of the ground-plane slotted type signal transmission circuit board of the invention.
Figure 7B:
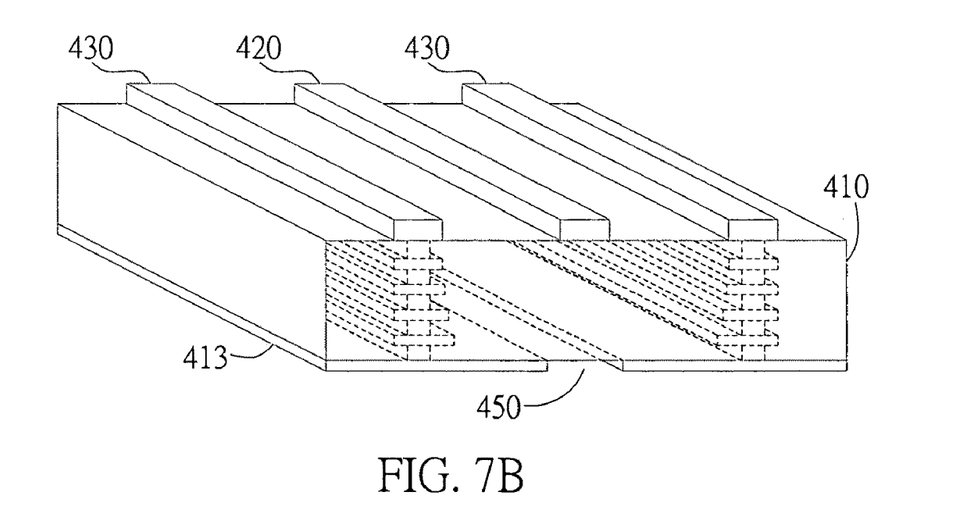
FIG. 7B is a schematic diagram showing a perspective view of the second preferred embodiment of the ground-plane slotted type signal transmission circuit board of the invention.

FIGS. 7A-7B show a second preferred embodiment of the ground-plane slotted type signal transmission circuit board of the invention (which is here labeled with the reference numeral 400), which is designed for providing a single-port signal transmission function (the first preferred embodiment is designed for dual-port signal transmission). As shown, the second preferred embodiment of the invention comprises: (A) a substrate 410; (B) a single-port signal line layout structure 420; (C) a grounding line layout structure 430; (D) a via structure 440; and (E) a slotted structure 450.

The second preferred embodiment differs from the first preferred embodiment shown in FIGS. 4A-4B only in that the signal line layout structure 420 includes only one single signal line for single-port signal transmission, rather than two signal lines in the first preferred embodiment. Beside this, all the other elements are identical in structure and function with the first preferred embodiment.

Operating Characteristics of the Invention

Figure 5A:
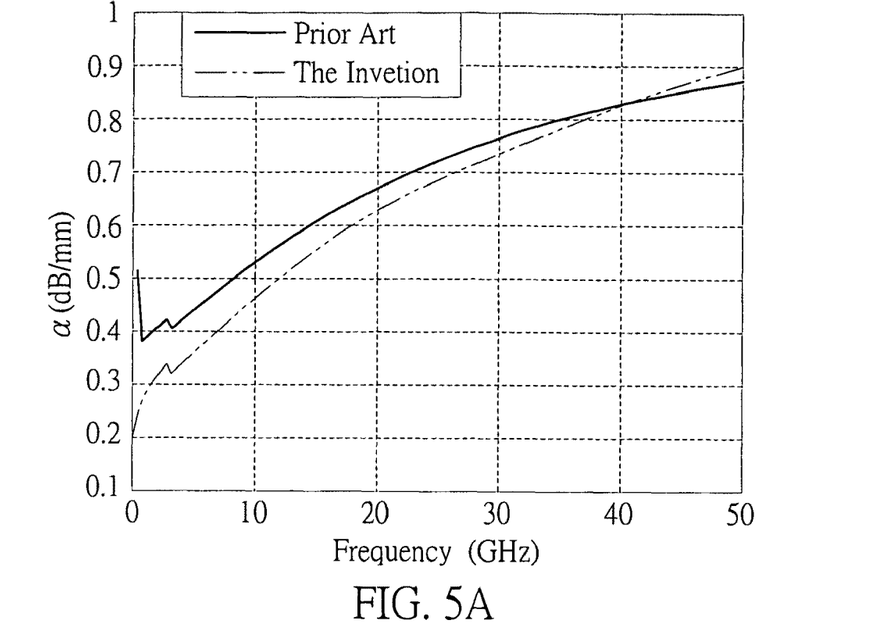
FIG. 5A is a graph showing a comparison of attenuation constants between the invention and the prior art.
Figure 5B:
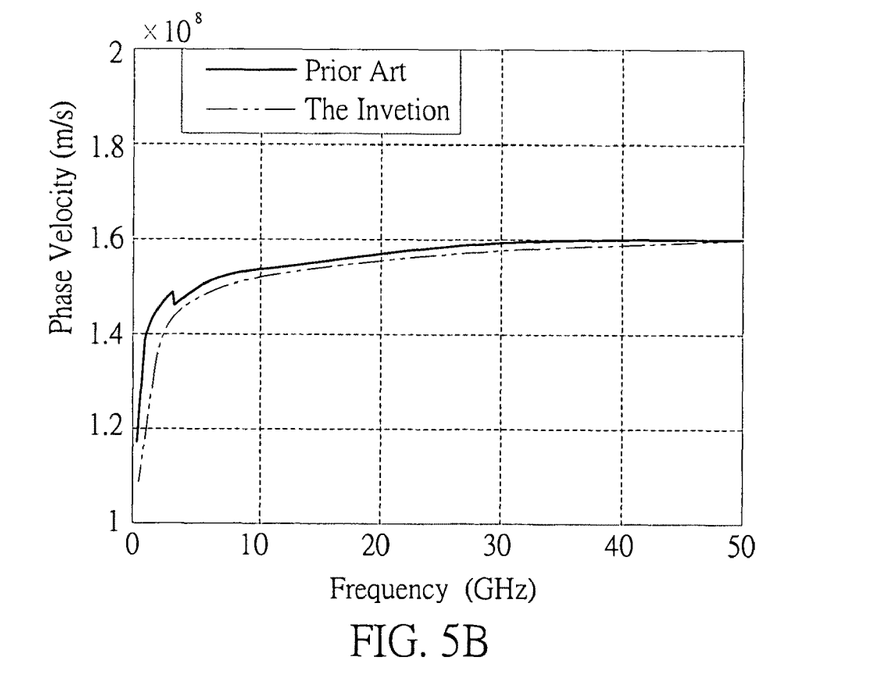
FIG. 5B is a graph showing a comparison of phase velocity between the invention and the prior art.
Figure 5C:
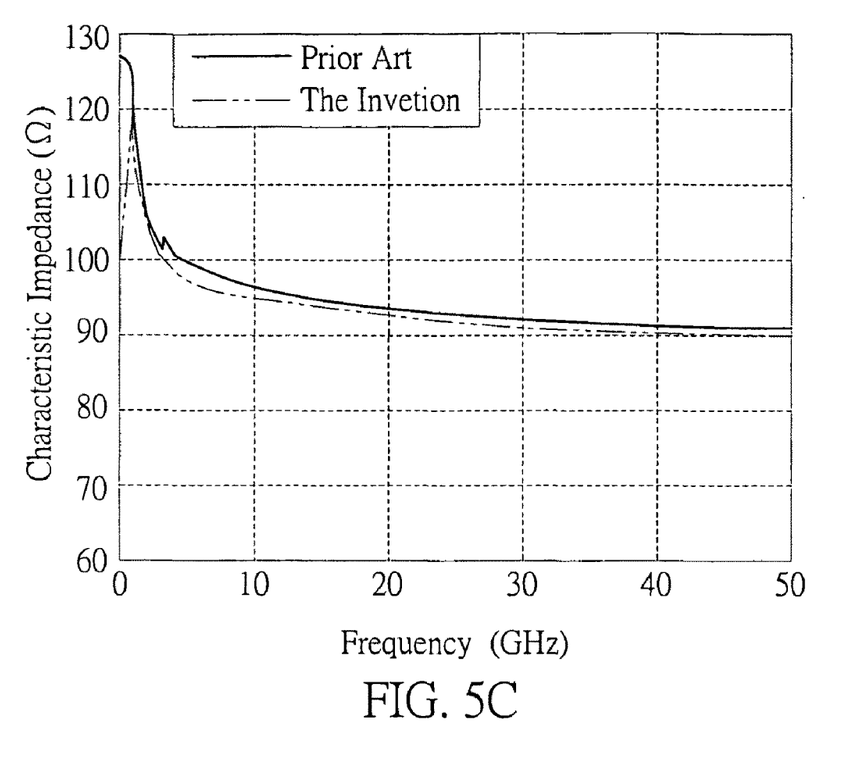
FIG. 5C is a graph showing a comparison of characteristic impedance between the invention and the prior art.

FIGS. 5A-5C are graphs showing a comparison between the invention and the prior art of the following three operating characteristics: attenuation constant, phase velocity, and characteristic impedance.

FIG. 5A is a graph showing a comparison of attenuation constants between the invention and the prior art of the semi-coaxial type circuit board structure 200 shown in FIG. 2. As shown, it can be seen that within the frequency range from 0 to 50 GHz, the invention provides a lower level of attenuation than the prior art; and within the frequency range from 40 GHz to 50 GHz, the invention provides a substantially equal level of attenuation as the prior art.

FIG. 5B is a graph showing a comparison of phase velocity between the invention and the prior art. As shown, it can be seen that within 0 GHz to 50 GHz, the invention provides a substantially equal phase velocity as the prior art.

FIG. 5C is a graph showing a comparison of characteristic impedance between the invention and the prior art. As shown, it can be seen that within 0 GHz to 50 GHz, the invention provides a substantially equal characteristic impedance as the prior art.

FIGS. 6A-6D are graphs showing a comparison between the invention and the prior art of the following operating characteristics in relation to the frequency of the input signal: resistance (R) per unit length, inductance (L) per unit length, conductance (G) per unit length, and capacitance (C) per unit length.

Figure 6A:
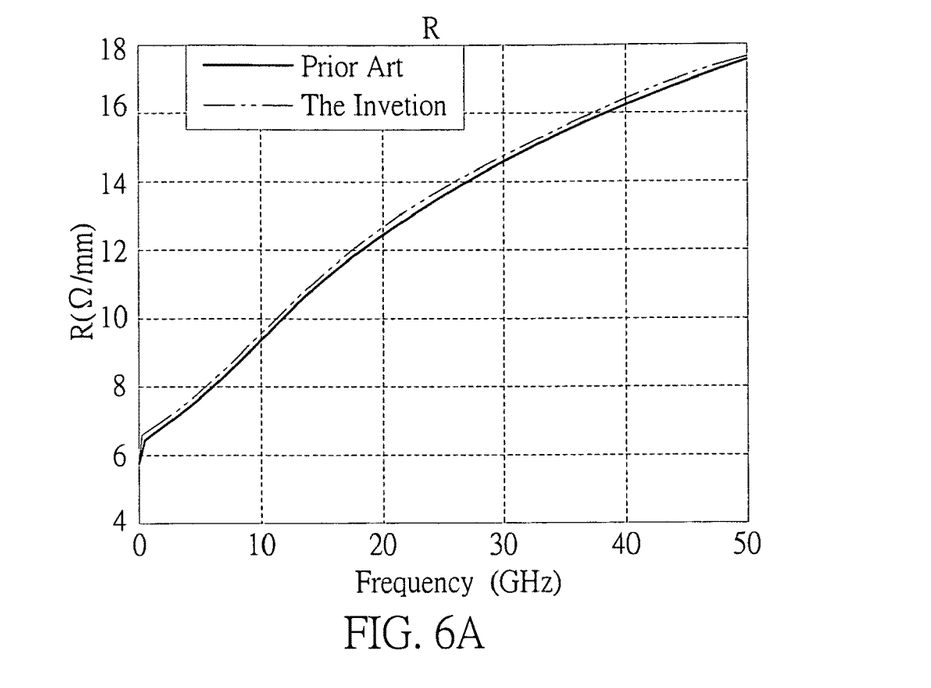
FIG. 6A is a graph showing a comparison of resistance (R) per unit length in relation to input signal frequency between the invention and the prior art.

FIG. 6A is a graph showing the comparison of resistance (R) per unit length in relation to input signal frequency between the invention and the prior art. As shown, it can be seen that within the frequency range from 0 GHz to 50 GHz, the invention provides a substantially equal resistance (R) per unit length as the prior art.

Figure 6B:
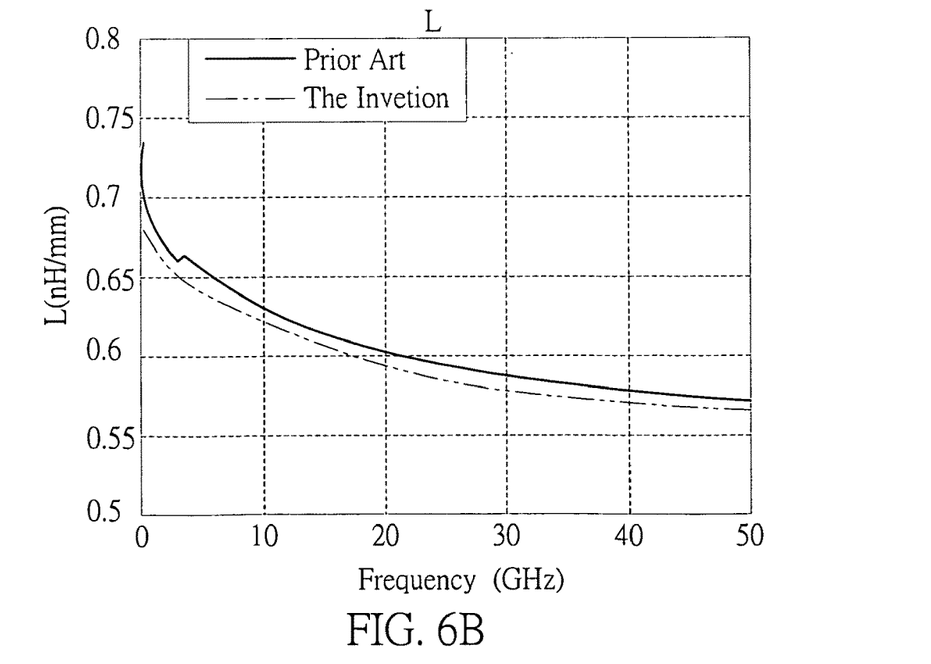
FIG. 6B is a graph showing a comparison of inductance (L) per unit length in relation to input signal frequency between the invention and the prior art.

FIG. 6B is a graph showing the comparison of inductance (L) per unit length in relation to input signal frequency between the invention and the prior art. As shown, it can be seen that within the frequency range from 0 GHz to 50 GHz, the invention provides a substantially equal inductance (L) per unit length as the prior art.

Figure 6C:
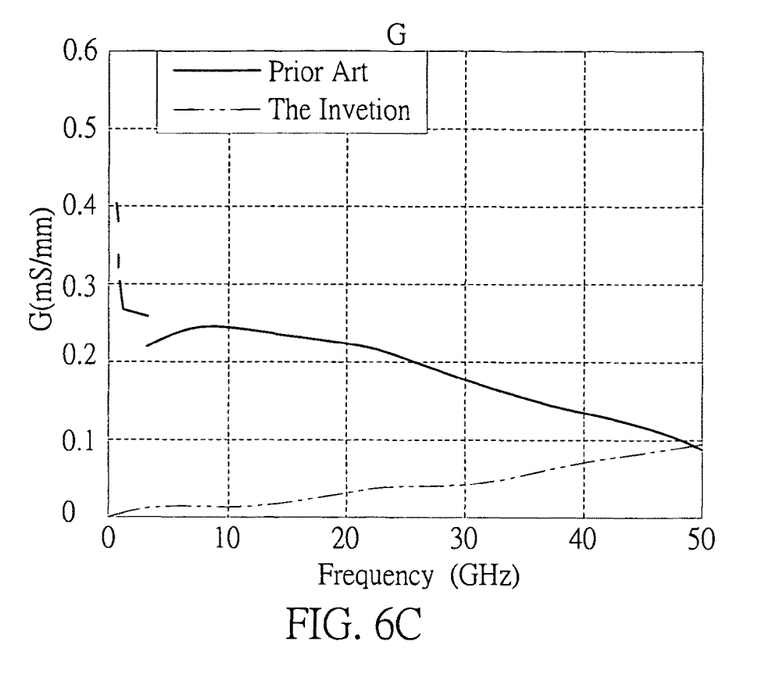
FIG. 6C is a graph showing a comparison of conductance (G) per unit length in relation to input signal frequency between the invention and the prior art.

FIG. 6C is a graph showing the comparison of conductance (G) per unit length in relation to input signal frequency between the invention and the prior art. As shown, it can be seen that within the frequency range from 0 GHz to 50 GHz, the invention is able to provide a smaller conductance (G) per unit length than the prior art.

Figure 6D:
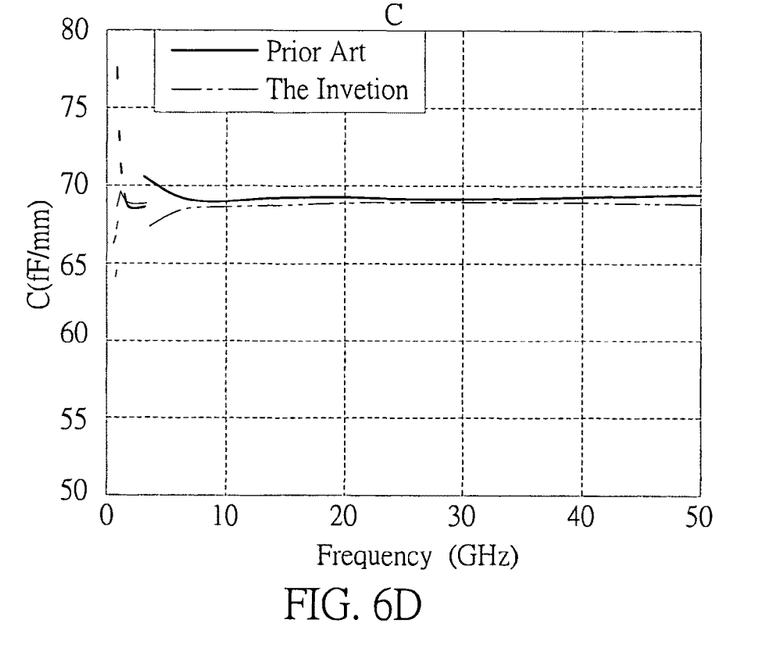
FIG. 6D is a graph showing a comparison of capacitance (C) per unit length in relation to input signal frequency between the invention and the prior art.

FIG. 6D is a graph showing the comparison of capacitance (C) per unit length in relation to input signal frequency between the invention and the prior art. As shown, it can be seen that within the frequency range from 0 GHz to 6 GHz, the invention provides a slightly smaller capacitance (C) per unit length than the prior art; and within 6 GHz to 50 GHz, the invention provides a substantially equal capacitance (C) per unit length as the prior art.

From the simulation results shown in FIGS. 6A-6D, it can be learned that within the operating frequency range, the invention is substantially equal in capability as the prior art to provide the same levels of (R, L, C). However, it can be seen that the invention is able to provide a smaller conductance (G) per unit length than the prior art; and as a result of a smaller G, the invention is able to provide a smaller level of attenuation than the prior art, and thus a lower level of signal energy loss than the prior art.

In conclusion, the invention provides a ground-plane slotted type signal transmission circuit board which is characterized by the formation of a slotted structure (i.e., elongated cutaway portion) in the ground plane at the beneath of each signal line. Since the slotted structure is a void portion, the electric field of a gigahertz signal being transmitting through the overlaying signal line would be unable to induce electric currents in the void portion of the ground plane. This feature allows the prevention of a leakage current that would otherwise flow from the signal line to the ground plane, and therefore can help prevent unnecessary power loss of the transmitted signal. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A ground-plane slotted type signal transmission circuit board for use as a circuit element for integration to a circuit system, comprising:
    a substrate, which has a first surface and an opposite second surface, and whose second surface is formed with a ground plane;
    a signal line layout structure, which is laid over the first surface of the substrate for use as a signal conveying channel;
    a grounding line layout structure, which is laid over the first surface of the substrate and extends alongside the signal line layout structure;
    a via structure, which penetrates through the substrate for connecting the grounding line layout structure on the first surface of the substrate to the ground plane on the second surface of the substrate; and
    a slotted structure, which is a cutaway portion of the ground plane on the second surface of the substrate, and which is aligned substantially in parallel to the signal line layout structure on the first surface of the substrate.

2. The ground-plane slotted type signal transmission circuit board of claim 1, wherein the signal line layout structure includes a pair of signal lines for dual-port transmission of a pair of differential signals.

3. The ground-plane slotted type signal transmission circuit board of claim 1, wherein the signal line layout structure includes one single signal line for single-port signal transmission.

4. The ground-plane slotted type signal transmission circuit board of claim 1, wherein the via structure is implemented with a tapered stack structure which is functionally equivalent to a semi-coaxial transmission line, and which is composed of an electrically conductive pillar and a plurality of stacked electrically-conductive planes.

5. The ground-plane slotted type signal transmission circuit board of claim 1, wherein the circuit system is a high-speed digital signal processing system.

6. The ground-plane slotted type signal transmission circuit board of claim 1, wherein the circuit element is a passive component.

7. The ground-plane slotted type signal transmission circuit board of claim 6, wherein the passive component is a filter.

8. The ground-plane slotted type signal transmission circuit board of claim 6, wherein the passive component is a power divider.

9. A ground-plane slotted type signal transmission circuit board for use as a circuit element for integration to a circuit system, comprising:
- a substrate, which has a first surface and an opposite second surface, and whose second surface is formed with a ground plane;
- a dual-port signal line layout structure, which is laid over the first surface of the substrate for use as a signal conveying channel, and which includes a pair of signal lines for dual-port transmission of a pair of differential signals;
- a grounding line layout structure, which is laid over the first surface of the substrate and extends alongside the signal line layout structure;
- a via structure, which penetrates through the substrate for connecting the grounding line layout structure on the first surface of the substrate to the ground plane on the second surface of the substrate; and
- a slotted structure, which is a cutaway portion of the ground plane on the second surface of the substrate, and which is aligned substantially in parallel to the signal line layout structure on the first surface of the substrate.

10. The ground-plane slotted type signal transmission circuit board of claim 9, wherein the via structure is implemented with a tapered stack structure which is functionally equivalent to a semi-coaxial transmission line, and which is composed of an electrically conductive pillar and a plurality of stacked electrically-conductive planes.

11. The ground-plane slotted type signal transmission circuit board of claim 9, wherein the circuit system is a high-speed digital signal processing system.

12. The ground-plane slotted type signal transmission circuit board of claim 9, wherein the circuit element is a passive component.

13. The ground-plane slotted type signal transmission circuit board of claim 12, wherein the passive component is a filter.

14. The ground-plane slotted type signal transmission circuit board of claim 12, wherein the passive component is a power divider.

15. A ground-plane slotted type signal transmission circuit board for use as a circuit element for integration to a circuit system, comprising:
- a substrate, which has a first surface and an opposite second surface, and whose second surface is formed with a ground plane;
- a single-port signal line layout structure, which is laid over the first surface of the substrate for use as a signal conveying channel, and which includes one single signal line for single-port signal transmission;
- a grounding line layout structure, which is laid over the first surface of the substrate and extends alongside the signal line layout structure;
- a via structure, which penetrates through the substrate for connecting the grounding line layout structure on the first surface of the substrate to the ground plane on the second surface of the substrate; and
- a slotted structure, which is a cutaway portion of the ground plane on the second surface of the substrate, and which is aligned substantially in parallel to the signal line layout structure on the first surface of the substrate.

16. The ground-plane slotted type signal transmission circuit board of claim 15, wherein the via structure is implemented with a tapered stack structure which is functionally equivalent to a semi-coaxial transmission line, and which is composed of an electrically conductive pillar and a plurality of stacked electrically-conductive planes.

17. The ground-plane slotted type signal transmission circuit board of claim 15, wherein the circuit system is a high-speed digital signal processing system.

18. The ground-plane slotted type signal transmission circuit board of claim 15, wherein the circuit element is a passive component.

19. The ground-plane slotted type signal transmission circuit board of claim 18, wherein the passive component is a filter.

20. The ground-plane slotted type signal transmission circuit board of claim 18, wherein the passive component is a power divider.

* * * * *